(12) United States Patent
Zednicek et al.

(10) Patent No.: US 8,199,462 B2
(45) Date of Patent: Jun. 12, 2012

(54) SOLID ELECTROLYTIC CAPACITOR FOR EMBEDDING INTO A CIRCUIT BOARD

(75) Inventors: Stanislav Zednicek, Lanskroun (CZ); Ladislav Marek, Lanskroun (CZ)

(73) Assignee: AVX Corporation, Myrtle Beach, SC (US)

( * ) Notice: Subject to any disclaimer, the term of this patent is extended or adjusted under 35 U.S.C. 154(b) by 487 days.

(21) Appl. No.: 12/206,186

(22) Filed: Sep. 8, 2008

(65) Prior Publication Data

US 2010/0061037 A1    Mar. 11, 2010

(51) Int. Cl.
H01G 4/228    (2006.01)
H01G 9/00     (2006.01)
H01K 1/18     (2006.01)

(52) U.S. Cl. .......................... 361/540; 361/523; 361/763

(58) Field of Classification Search .................. 361/523, 361/540, 533, 538, 535, 763
See application file for complete search history.

(56) References Cited

U.S. PATENT DOCUMENTS

| | | |
|---|---|---|
| 2,756,485 A | 7/1956 | Abramson et al. |
| 2,936,514 A | 5/1960 | Millard |
| 3,345,545 A | 10/1967 | Bourgault et al. |
| 3,588,628 A | 6/1971 | Beck |
| 3,781,976 A | 1/1974 | Tomiwa |
| 3,789,274 A | 1/1974 | Pfister |
| 3,828,227 A | 8/1974 | Millard et al. |
| 3,997,821 A | 12/1976 | Sternbeck |
| 4,017,773 A | 4/1977 | Cheseldine |
| 4,085,435 A | 4/1978 | Galvagni |
| 4,107,762 A | 8/1978 | Shirn et al. |
| 4,247,883 A | 1/1981 | Thompson et al. |
| 4,288,842 A | 9/1981 | Voyles |
| 4,488,204 A | 12/1984 | Beck, Jr. |
| 4,497,105 A | 2/1985 | Uemura |
| 4,571,662 A | 2/1986 | Conquest et al. |
| 4,648,180 A | 3/1987 | Holt |
| 4,675,790 A | 6/1987 | DeMatos et al. |
| 4,945,452 A | 7/1990 | Sturmer et al. |

(Continued)

FOREIGN PATENT DOCUMENTS

EP    1061537 A2    12/2000

(Continued)

OTHER PUBLICATIONS

Abstract of Japanese Patent No. JP1227422, Mar. 7, 1988.

(Continued)

*Primary Examiner* — Eric Thomas
*Assistant Examiner* — David M Sinclair
(74) *Attorney, Agent, or Firm* — Dority & Manning, P.A.

(57) ABSTRACT

An electrolytic capacitor that is configured to be embedded into a circuit board is provided. The electrolytic capacitor contains a capacitor element, anode and cathode terminations, and a case that encapsulates the capacitor element and leaves at least a portion of the anode and cathode terminations exposed that extend outwardly from opposite ends of the case. Each of the terminations possesses an upper surface that faces toward the capacitor element and a lower surface that faces away from the capacitor element. In contrast to conventional surface-mounted electrolytic capacitors, the upper surfaces of these exposed anode and cathode termination portions are mounted to the circuit board. In this manner, the capacitor may essentially be mounted "upside down" so that some or all of its thickness becomes embedded within the board itself, thereby minimizing the height profile of the capacitor on the board.

16 Claims, 5 Drawing Sheets

U.S. PATENT DOCUMENTS

| | | | |
|---|---|---|---|
| 4,972,299 | A | 11/1990 | Hagiwara et al. |
| 5,198,968 | A | 3/1993 | Galvagni |
| 5,349,496 | A | 9/1994 | Taniguchi et al. |
| 5,357,399 | A | 10/1994 | Salisbury |
| 5,390,074 | A | 2/1995 | Hasegawa et al. |
| 5,394,295 | A | 2/1995 | Galvagni et al. |
| 5,457,862 | A | 10/1995 | Sakata et al. |
| 5,461,537 | A | 10/1995 | Kobayashi et al. |
| 5,473,503 | A | 12/1995 | Sakata et al. |
| 5,495,386 | A | 2/1996 | Kukkarni |
| 5,729,428 | A | 3/1998 | Sakata et al. |
| 5,801,438 | A * | 9/1998 | Shirakawa et al. ........... 257/685 |
| 5,812,367 | A | 9/1998 | Kudoh et al. |
| 5,840,086 | A | 11/1998 | Takami et al. |
| 5,894,402 | A * | 4/1999 | Strange et al. ................ 361/514 |
| 5,943,216 | A * | 8/1999 | Schmidt ........................ 361/761 |
| 5,949,639 | A | 9/1999 | Maeda et al. |
| 6,017,367 | A | 1/2000 | Nakata |
| 6,154,371 | A * | 11/2000 | Oba et al. ...................... 361/764 |
| 6,191,936 | B1 | 2/2001 | Webber et al. |
| 6,197,252 | B1 | 3/2001 | Bishop et al. |
| 6,236,561 | B1 | 5/2001 | Ogino et al. |
| 6,262,878 | B1 | 7/2001 | Shirashige et al. |
| 6,322,912 | B1 | 11/2001 | Fife |
| 6,333,844 | B1 | 12/2001 | Nakamura |
| 6,346,127 | B1 | 2/2002 | Kuriyama |
| 6,380,577 | B1 | 4/2002 | Cadwallader |
| 6,391,275 | B1 | 5/2002 | Fife |
| 6,400,556 | B1 | 6/2002 | Masuda et al. |
| 6,416,730 | B1 | 7/2002 | Fife |
| 6,430,034 | B2 | 8/2002 | Sano et al. |
| 6,467,142 | B1 | 10/2002 | Shirashige et al. |
| 6,477,030 | B2 | 11/2002 | Hidaka et al. |
| 6,519,135 | B2 | 2/2003 | Sano et al. |
| 6,527,937 | B2 | 3/2003 | Fife |
| 6,576,099 | B2 | 6/2003 | Kimmel et al. |
| 6,592,740 | B2 | 7/2003 | Fife |
| 6,616,713 | B2 | 9/2003 | Sano et al. |
| 6,625,009 | B2 * | 9/2003 | Maeda ........................... 361/528 |
| 6,639,787 | B2 | 10/2003 | Kimmel et al. |
| 6,665,172 | B1 | 12/2003 | Kim et al. |
| 6,674,635 | B1 | 1/2004 | Fife et al. |
| 6,680,841 | B2 | 1/2004 | Tadanobu et al. |
| 6,717,793 | B2 | 4/2004 | Arai et al. |
| 6,751,086 | B2 | 6/2004 | Matsumoto |
| 6,808,541 | B2 | 10/2004 | Maeda |
| 6,870,727 | B2 | 3/2005 | Edson et al. |
| 6,870,728 | B1 | 3/2005 | Burket et al. |
| 6,882,521 | B2 | 4/2005 | Tsutsui et al. |
| 6,891,717 | B2 | 5/2005 | Fujii et al. |
| 6,903,921 | B2 | 6/2005 | Ishijima |
| 6,903,922 | B2 | 6/2005 | Sano et al. |
| 6,920,037 | B2 | 7/2005 | Sano et al. |
| 6,970,345 | B2 | 11/2005 | Oh et al. |
| 6,992,880 | B2 | 1/2006 | Tadanobu et al. |
| 6,995,972 | B2 | 2/2006 | Fujii et al. |
| 7,027,291 | B2 | 4/2006 | Horio et al. |
| 7,057,882 | B2 | 6/2006 | Fujii et al. |
| 7,116,548 | B2 | 10/2006 | Satterfield, Jr. et al. |
| 7,158,368 | B2 | 1/2007 | Fujii et al. |
| 7,184,257 | B2 | 2/2007 | Kobayashi et al. |
| 7,220,397 | B2 | 5/2007 | Kimmel et al. |
| 7,262,511 | B2 | 8/2007 | Osako et al. |
| 7,271,995 | B2 | 9/2007 | Edson et al. |
| 7,341,705 | B2 | 3/2008 | Schnitter |
| 7,351,915 | B2 | 4/2008 | Ahn et al. |
| 7,381,396 | B2 | 6/2008 | Thomas et al. |
| 7,419,926 | B2 | 9/2008 | Schnitter et al. |
| 7,449,032 | B2 | 11/2008 | Vaisman et al. |
| 7,570,480 | B2 * | 8/2009 | Kim et al. ...................... 361/540 |
| 7,729,102 | B2 * | 6/2010 | Kuriyama ...................... 361/523 |
| 2003/0104923 | A1 | 6/2003 | Omori et al. |
| 2008/0062617 | A1 | 3/2008 | Edson et al. |
| 2008/0247122 | A1 | 10/2008 | Vaisman et al. |
| 2008/0285209 | A1 * | 11/2008 | Horio ............................. 361/523 |
| 2009/0147448 | A1 | 6/2009 | Matsuoka et al. |

FOREIGN PATENT DOCUMENTS

| | | | |
|---|---|---|---|
| GB | 1328780 | A | 9/1973 |
| GB | 1366847 | A | 9/1974 |
| GB | 1541049 | A | 2/1979 |
| GB | 2123610 | A | 2/1984 |
| JP | 129050 | | 6/1989 |
| JP | 1276613 | | 7/1989 |
| JP | 5234828 | | 9/1993 |
| JP | H7106204 | | 4/1995 |
| JP | H1187175 | | 3/1999 |
| JP | 11288844 | | 10/1999 |
| JP | 2006032415 | A * | 2/2006 |
| WO | WO 2006064669 | A1 * | 6/2006 |

OTHER PUBLICATIONS

Abstract of Japanese Patent No. JP2087612, Sep. 11, 1989.
Abstract of Japanese Patent No. JP6005478, Jan. 14, 1994.
Abstract of Japanese Patent No. JP7106204, Apr. 21, 1995.
Abstract of Japanese Patent No. JP7240343, Sep. 12, 1995.
Abstract of Japanese Patent No. JP8130166, May 21, 1996.
Abstract of Japanese Patent No. JP2000049048, Feb. 18, 2000.
Abstract of Japanese Patent No. JP2001291641, Oct. 19, 2001.
Abstract of Japanese Patent No. JP2001110676, Apr. 20, 2001.
Article—*Adsorption of Gases in Multimolecular Layers*, Brunauer et al., The Journal of the American Chemical Society, vol. 60, Jan.-Jun. 1938, pp. 309-319.
Search Report for GB0909929.2 dated Mar. 15, 2010, 4 pages.

* cited by examiner

US 8,199,462 B2

SOLID ELECTROLYTIC CAPACITOR FOR EMBEDDING INTO A CIRCUIT BOARD

BACKGROUND OF THE INVENTION

Solid electrolytic capacitors (e.g., tantalum capacitors) have been a major contributor to the miniaturization of electronic circuits and have made possible the application of such circuits in extreme environments. Many conventional solid electrolytic capacitors are formed with J-shaped terminations that can be surface mounted onto a printed circuit board. These terminations are present on the ends of the capacitor and thus extend its overall length. Thus, when a number of these capacitors are mounted on a board in a side-by-side fashion, the spacing must be made large enough to prevent short-circuiting, which prevents dense packing of the capacitors. Capacitors have also been developed in which the terminations are located primarily on the bottom of the capacitor—also known as "facedown" terminations. When surface mounted onto the board, however, the height of these capacitors still limits miniaturization, particular for relatively larger case sizes.

As such, a need remains for a solid electrolytic capacitor that is able to achieve high density packing when mounted to a circuit board.

SUMMARY OF THE INVENTION

In accordance with one embodiment of the present invention, a solid electrolytic capacitor is disclosed that comprises a capacitor element that defines an upper surface, lower surface, front surface, and rear surface. The capacitor element includes an anode, dielectric layer overlying the anode, and a cathode overlying the dielectric layer that includes a solid electrolyte, and wherein an anode lead is electrically connected to the anode. The capacitor also comprises an anode termination that is electrically connected to the anode lead and a cathode termination that is electrically connected to the cathode. The anode termination contains a first component that is generally parallel to the lower surface of the capacitor element and the cathode termination contains a second component that is generally parallel to the lower surface of the capacitor element. Further, the capacitor comprises a case that encapsulates the capacitor element and leaves exposed at least a portion of the first component and the second component. The exposed portions of the first component and the second component are generally coplanar and extend outwardly from the case, and respectively define an upper surface facing an upper surface of the capacitor element and an opposing lower surface facing away from the upper surface of the capacitor element. The upper surfaces of the first component and the second component are configured to be mounted to a circuit board.

In accordance with another embodiment of the present invention, a circuit board is disclosed that comprises a substrate that defines a mounting surface on which is located opposing conductive members. A recessed opening is provided in the mounting surface between the conductive members. Further, the board contains a solid electrolytic capacitor that contains an anode termination and a cathode termination extending outwardly from the capacitor in a generally coplanar relationship. The anode and cathode terminations are electrically connected to respective conductive members so that the capacitor is embedded within the recessed opening.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Figure 1:
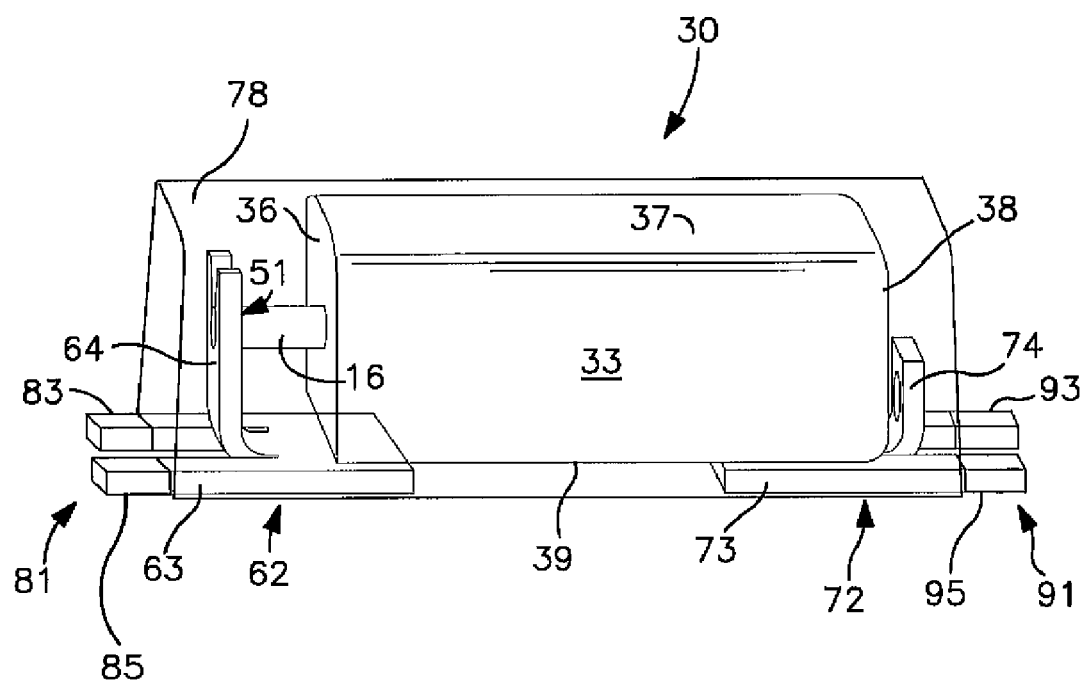
FIG. 1 is a perspective view of one embodiment of the electrolytic capacitor of the present invention.
Figure 1:
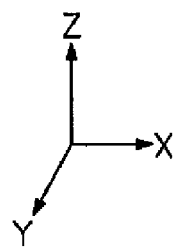

Repeat use of reference characters in the present specification and drawings is intended to represent the same or analogous features or elements of the present invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention.

Generally speaking, the present invention is directed to an electrolytic capacitor that is configured to be embedded into a circuit board. The electrolytic capacitor contains a capacitor element, anode and cathode terminations, and a case that encapsulates the capacitor element and leaves at least a portion of the anode and cathode terminations exposed that extend outwardly from opposite ends of the case. Each of the terminations possesses an upper surface that faces toward the capacitor element and a lower surface that faces away from the capacitor element. In contrast to conventional surface-mounted electrolytic capacitors, the upper surfaces of these exposed anode and cathode termination portions are mounted to the circuit board. In this manner, the capacitor may essentially be mounted "upside down" so that some or all of its thickness becomes embedded within the board itself, thereby minimizing the height profile of the capacitor on the board.

The anode may be formed from a valve metal composition having a high specific charge, such as about 5,000 μF*V/g or more, in some embodiments about 25,000 μF*V/g or more, in some embodiments about 40,000 μF*V/g or more, and in some embodiments, from about 70,000 to about 200,000 μF*V/g or more. The valve metal composition contains a valve metal (i.e., metal that is capable of oxidation) or valve metal-based compound, such as tantalum, niobium, aluminum, hafnium, titanium, alloys thereof, oxides thereof, nitrides thereof, and so forth. For example, the valve metal composition may contain an electrically conductive oxide of niobium, such as niobium oxide having an atomic ratio of niobium to oxygen of 1:1.0±1.0, in some embodiments 1:1.0±0.3, in some embodiments 1:1.0±0.1, and in some embodiments, 1:1.0±0.05. For example, the niobium oxide may be $NbO_{0.7}$, $NbO_{1.0}$, $NbO_{1.1}$, and $NbO_2$. In a preferred embodiment, the composition contains $NbO_{1.0}$, which is a conductive niobium oxide that may remain chemically stable even after sintering at high temperatures. Examples of such valve metal oxides are described in U.S. Pat. Nos. 6,322,912 to Fife; 6,391,275 to Fife et al.; 6,416,730 to Fife et al.;

6,527,937 to Fife; 6,576,099 to Kimmel, et al.; 6,592,740 to Fife, et al.; and 6,639,787 to Kimmel, et al.; and 7,220,397 to Kimmel, et al., as well as U.S. Patent Application Publication Nos. 2005/0019581 to Schnitter; 2005/0103638 to Schnitter, et al.; 2005/0013765 to Thomas, et al., all of which are incorporated herein in their entirety by reference thereto for all purposes.

Conventional fabricating procedures may generally be utilized to form the anode. In one embodiment, a tantalum or niobium oxide powder having a certain particle size is first selected. For example, the particles may be flaked, angular, nodular, and mixtures or variations thereof. The particles also typically have a screen size distribution of at least about 60 mesh, in some embodiments from about 60 to about 325 mesh, and in some embodiments, from about 100 to about 200 mesh. Further, the specific surface area is from about 0.1 to about 10.0 $m^2/g$, in some embodiments from about 0.5 to about 5.0 $m^2/g$, and in some embodiments, from about 1.0 to about 2.0 $m^2/g$. The term "specific surface area" refers to the surface area determined by the physical gas adsorption (B.E.T.) method of Bruanauer, Emmet, and Teller, Journal of American Chemical Society, Vol. 60, 1938, p. 309, with nitrogen as the adsorption gas. Likewise, the bulk (or Scott) density is typically from about 0.1 to about 5.0 $g/cm^3$, in some embodiments from about 0.2 to about 4.0 $g/cm^3$, and in some embodiments, from about 0.5 to about 3.0 $g/cm^3$.

To facilitate the construction of the anode, other components may be added to the electrically conductive particles. For example, the electrically conductive particles may be optionally mixed with a binder and/or lubricant to ensure that the particles adequately adhere to each other when pressed to form the anode body. Suitable binders may include camphor, stearic and other soapy fatty acids, Carbowax (Union Carbide), Glyptal (General Electric), polyvinyl alcohols, naphthalene, vegetable wax, and microwaxes (purified paraffins). The binder may be dissolved and dispersed in a solvent. Exemplary solvents may include water, alcohols, and so forth. When utilized, the percentage of binders and/or lubricants may vary from about 0.1% to about 8% by weight of the total mass. It should be understood, however, that binders and lubricants are not required in the present invention.

The resulting powder may be compacted using any conventional powder press mold. For example, the press mold may be a single station compaction press using a die and one or multiple punches. Alternatively, anvil-type compaction press molds may be used that use only a die and single lower punch. Single station compaction press molds are available in several basic types, such as cam, toggle/knuckle and eccentric/crank presses with varying capabilities, such as single action, double action, floating die, movable platen, opposed ram, screw, impact, hot pressing, coining or sizing. The powder may be compacted around an anode lead (e.g., tantalum wire). It should be further appreciated that the anode lead may alternatively be attached (e.g., welded) to the anode body subsequent to pressing and/or sintering of the anode body. After compression, any binder/lubricant may be removed by heating the pellet under vacuum at a certain temperature (e.g., from about 150° C. to about 500° C.) for several minutes. Alternatively, the binder/lubricant may also be removed by contacting the pellet with an aqueous solution, such as described in U.S. Pat. No. 6,197,252 to Bishop, et al., which is incorporated herein in its entirety by reference thereto for all purposes. Thereafter, the pellet is sintered to form a porous, integral mass. For example, in one embodiment, the pellet may be sintered at a temperature of from about 1200° C. to about 2000° C., and in some embodiments, from about 1500° C. to about 1800° C. under vacuum or an inert atmosphere. Upon sintering, the pellet shrinks due to the growth of bonds between the particles. In addition to the techniques described above, any other technique for constructing the anode body may also be utilized in accordance with the present invention, such as described in U.S. Pat. Nos. 4,085,435 to Galvagni; 4,945,452 to Sturmer, et al.; 5,198,968 to Galvagni; 5,357,399 to Salisbury; 5,394,295 to Galvagni, et al.; 5,495,386 to Kulkarni; and 6,322,912 to Fife, which are incorporated herein in their entirety by reference thereto for all purposes.

Although not required, the thickness of the anode may be selected to improve the electrical performance of the capacitor. For example, the thickness of the anode may be about 4 millimeters or less, in some embodiments, from about 0.05 to about 2 millimeters, and in some embodiments, from about 0.1 to about 1 millimeter. The shape of the anode may also be selected to improve the electrical properties of the resulting capacitor. For example, the anode may have a shape that is curved, sinusoidal, rectangular, U-shaped, V-shaped, etc. The anode may also have a "fluted" shape in that it contains one or more furrows, grooves, depressions, or indentations to increase the surface to volume ratio to minimize ESR and extend the frequency response of the capacitance. Such "fluted" anodes are described, for instance, in U.S. Pat. Nos. 6,191,936 to Webber, et al.; 5,949,639 to Maeda, et al.; and 3,345,545 to Bourgault et al., as well as U.S. Patent Application Publication No. 2005/0270725 to Hahn, et al., all of which are incorporated herein in their entirety by reference thereto for all purposes.

Once constructed, the anode may be anodized so that a dielectric layer is formed over and/or within the anode. Anodization is an electrochemical process by which the anode is oxidized to form a material having a relatively high dielectric constant. For example, a niobium oxide (NbO) anode may be anodized to niobium pentoxide ($Nb_2O_5$). Typically, anodization is performed by initially applying an electrolyte to the anode, such as by dipping anode into the electrolyte. The electrolyte is generally in the form of a liquid, such as a solution (e.g., aqueous or non-aqueous), dispersion, melt, etc. A solvent is generally employed in the electrolyte, such as water (e.g., deionized water); ethers (e.g., diethyl ether and tetrahydrofuran); alcohols (e.g., methanol, ethanol, n-propanol, isopropanol, and butanol); triglycerides; ketones (e.g., acetone, methyl ethyl ketone, and methyl isobutyl ketone); esters (e.g., ethyl acetate, butyl acetate, diethylene glycol ether acetate, and methoxypropyl acetate); amides (e.g., dimethylformamide, dimethylacetamide, dimethylcaprylic/capric fatty acid amide and N-alkylpyrrolidones); nitrites (e.g., acetonitrile, propionitrile, butyronitrile and benzonitrile); sulfoxides or sulfones (e.g., dimethyl sulfoxide (DMSO) and sulfolane); and so forth. The solvent may constitute from about 50 wt. % to about 99.9 wt. %, in some embodiments from about 75 wt. % to about 99 wt. %, and in some embodiments, from about 80 wt. % to about 95 wt. % of the electrolyte. Although not necessarily required, the use of an aqueous solvent (e.g., water) is often desired to help achieve the desired oxide. In fact, water may constitute about 50 wt. % or more, in some embodiments, about 70 wt. % or more, and in some embodiments, about 90 wt. % to 100 wt. % of the solvent(s) used in the electrolyte.

The electrolyte is ionically conductive and may have an ionic conductivity of about 1 milliSiemens per centimeter ("mS/cm") or more, in some embodiments about 30 mS/cm or more, and in some embodiments, from about 40 mS/cm to about 100 mS/cm, determined at a temperature of 25° C. To enhance the ionic conductivity of the electrolyte, a compound may be employed that is capable of dissociating in the solvent to form ions. Suitable ionic compounds for this purpose may include, for instance, acids, such as hydrochloric acid, nitric acid, sulfuric acid, phosphoric acid, polyphosphoric acid, boric acid, boronic acid, etc.; organic acids, including carboxylic acids, such as acrylic acid, methacrylic acid, malonic acid, succinic acid, salicylic acid, sulfosalicylic acid, adipic acid, maleic acid, malic acid, oleic acid, gallic acid, tartaric acid, citric acid, formic acid, acetic acid, glycolic acid, oxalic acid, propionic acid, phthalic acid, isophthalic acid, glutaric acid, gluconic acid, lactic acid, aspartic acid, glutaminic acid, itaconic acid, trifluoroacetic acid, barbituric acid, cinnamic acid, benzoic acid, 4-hydroxybenzoic acid, aminobenzoic acid, etc.; sulfonic acids, such as methanesulfonic acid, benzenesulfonic acid, toluenesulfonic acid, trifluoromethanesulfonic acid, styrenesulfonic acid, naphthalene disulfonic acid, hydroxybenzenesulfonic acid, dodecylsulfonic acid, dodecylbenzenesulfonic acid, etc.; polymeric acids, such as poly(acrylic) or poly(methacrylic) acid and copolymers thereof (e.g., maleic-acrylic, sulfonic-acrylic, and styrene-acrylic copolymers), carageenic acid, carboxymethyl cellulose, alginic acid, etc.; and so forth. The concentration of ionic compounds is selected to achieve the desired ionic conductivity. For example, an acid (e.g., phosphoric acid) may constitute from about 0.01 wt. % to about 5 wt. %, in some embodiments from about 0.05 wt. % to about 0.8 wt. %, and in some embodiments, from about 0.1 wt. % to about 0.5 wt. % of the electrolyte. If desired, blends of ionic compounds may also be employed in the electrolyte.

A current is passed through the electrolyte to form the dielectric layer. The value of voltage manages the thickness of the dielectric layer. For example, the power supply may be initially set up at a galvanostatic mode until the required voltage is reached. Thereafter, the power supply may be switched to a potentiostatic mode to ensure that the desired dielectric thickness is formed over the surface of the anode. Of course, other known methods may also be employed, such as pulse or step potentiostatic methods. The voltage typically ranges from about 4 to about 200 V, and in some embodiments, from about 9 to about 100 V. During anodic oxidation, the electrolyte can be kept at an elevated temperature, such as about 30° C. or more, in some embodiments from about 40° C. to about 200° C., and in some embodiments, from about 50° C. to about 100° C. Anodic oxidation can also be done at ambient temperature or lower. The resulting dielectric layer may be formed on a surface of the anode and within its pores.

Once the dielectric layer is formed, a protective coating may optionally be applied, such as one made of a relatively insulative resinous material (natural or synthetic). Such materials may have a specific resistivity of greater than about 10 Ω/cm, in some embodiments greater than about 100, in some embodiments greater than about 1,000 Ω/cm, in some embodiments greater than about $1 \times 10^5$ Ω/cm, and in some embodiments, greater than about $1 \times 10^{10}$ Ω/cm. Some resinous materials that may be utilized in the present invention include, but are not limited to, polyurethane, polystyrene, esters of unsaturated or saturated fatty acids (e.g., glycerides), and so forth. For instance, suitable esters of fatty acids include, but are not limited to, esters of lauric acid, myristic acid, palmitic acid, stearic acid, eleostearic acid, oleic acid, linoleic acid, linolenic acid, aleuritic acid, shellolic acid, and so forth. These esters of fatty acids have been found particularly useful when used in relatively complex combinations to form a "drying oil", which allows the resulting film to rapidly polymerize into a stable layer. Such drying oils may include mono-, di-, and/or tri-glycerides, which have a glycerol backbone with one, two, and three, respectively, fatty acyl residues that are esterified. For instance, some suitable drying oils that may be used include, but are not limited to, olive oil, linseed oil, castor oil, tung oil, soybean oil, and shellac. These and other protective coating materials are described in more detail U.S. Pat. No. 6,674,635 to Fife, et al., which is incorporated herein in its entirety by reference thereto for all purposes.

The anodized part is thereafter subjected to a step for forming a cathode that includes a solid electrolyte, such as a manganese dioxide, conductive polymer, etc. A manganese dioxide solid electrolyte may, for instance, be formed by the pyrolytic decomposition of manganous nitrate ($Mn(NO_3)_2$). Such techniques are described, for instance, in U.S. Pat. No. 4,945,452 to Sturmer, et al., which is incorporated herein in its entirety by reference thereto for all purposes. Alternatively, a conductive polymer coating may be employed that contains one or more polyheterocycles (e.g., polypyrroles; polythiophenes, poly(3,4-ethylenedioxythiophene) (PEDT); polyanilines); polyacetylenes; poly-p-phenylenes; polyphenolates; and derivatives thereof. Moreover, if desired, the conductive polymer coating may also be formed from multiple conductive polymer layers. For example, in one embodiment, the conductive polymer cathode may contain one layer formed from PEDT and another layer formed from a polypyrrole. Various methods may be utilized to apply the conductive polymer coating onto the anode part. For instance, conventional techniques such as electropolymerization, screen-printing, dipping, electrophoretic coating, and spraying, may be used to form a conductive polymer coating. In one embodiment, for example, the monomer(s) used to form the conductive polymer (e.g., 3,4-ethylenedioxy-thiophene) may initially be mixed with a polymerization catalyst to form a solution. For example, one suitable polymerization catalyst is CLEVIOS C, which is iron III toluene-sulfonate and sold by H. C. Starck. CLEVIOS C is a commercially available catalyst for CLEVIOS M, which is 3,4-ethylene dioxythiophene, a PEDT monomer also sold by H. C. Starck. Once a catalyst dispersion is formed, the anode part may then be dipped into the dispersion so that the polymer forms on the surface of the anode part. Alternatively, the catalyst and monomer(s) may also be applied separately to the anode part. In one embodiment, for example, the catalyst may be dissolved in a solvent (e.g., butanol) and then applied to the anode part as a dipping solution. The anode part may then be dried to remove the solvent therefrom. Thereafter, the anode part may be dipped into a solution containing the appropriate monomer. Once the monomer contacts the surface of the anode part containing the catalyst, it chemically polymerizes thereon. In addition, the catalyst (e.g., CLEVIOS C) may also be mixed with the material(s) used to form the optional protective coating (e.g., resinous materials). In such instances, the anode part may then be dipped into a solution containing the monomer (CLEVIOS M). As a result, the monomer can contact the catalyst within and/or on the surface of the protective coating and react therewith to form the conductive polymer coating. Although various methods have been described above, it should be understood that any other method for applying the conductive coating(s) to the anode part may also be utilized in the present invention. For example, other methods for applying such conductive polymer coating(s) may be described in U.S. Pat. Nos. 5,457,862 to Sakata. et al., 5,473,503 to Sakata, et al., 5,729,428 to Sakata, et al., and 5,812,367 to Kudoh, et al., which are incorporated herein in their entirety by reference thereto for all purposes.

In most embodiments, once applied, the solid electrolyte is healed. Healing may occur after each application of a solid electrolyte layer or may occur after the application of the entire coating. In some embodiments, for example, the solid electrolyte may be healed by dipping the pellet into an electrolyte solution, such as a solution of phosphoric acid and/or sulfuric acid, and thereafter applying a constant voltage to the solution until the current is reduced to a preselected level. If desired, such healing may be accomplished in multiple steps. For instance, in one embodiment, a pellet having a conductive polymer coating is first dipped in phosphoric acid and applied with about 20 Volts and then dipped in sulfuric acid and applied with about 2 Volts. In this embodiment, the use of the second low voltage sulfuric acid solution or toluene sulfonic acid can help increase capacitance and reduce the dissipation factor (DF) of the resulting capacitor. After application of some or all of the layers described above, the pellet may then be washed if desired to remove various byproducts, excess catalysts, and so forth. Further, in some instances, drying may be utilized after some or all of the dipping operations described above. For example, drying may be desired after applying the catalyst and/or after washing the pellet in order to open the pores of the pellet so that it can receive a liquid during subsequent dipping steps.

If desired, the part may optionally be applied with a carbon layer (e.g., graphite) and silver layer, respectively. The silver coating may, for instance, act as a solderable conductor, contact layer, and/or charge collector for the capacitor and the carbon coating may limit contact of the silver coating with the solid electrolyte. Such coatings may cover some or all of the solid electrolyte.

As indicated above, the electrolytic capacitor of the present invention also contains an anode termination to which the anode lead of the capacitor element is electrically connected and a cathode termination to which the cathode of the capacitor element is electrically connected. Any conductive material may be employed to form the terminations, such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). The thickness of the terminations is generally selected to minimize the thickness of the capacitor. For instance, the thickness of the terminations may range from about 0.05 to about 1 millimeter, in some embodiments from about 0.05 to about 0.5 millimeters, and from about 0.07 to about 0.2 millimeters. One exemplary conductive material is a copper-iron alloy metal plate available from Wieland (Germany). If desired, the surface of the terminations may be electroplated with nickel, silver, gold, tin, etc. as is known in the art to ensure that the final part is mountable to the circuit board. In one particular embodiment, both surfaces of the terminations are plated with nickel and silver flashes, respectively, while the mounting surface is also plated with a tin solder layer.

Referring to FIG. 1, one embodiment of an electrolytic capacitor 30 is shown that includes an anode termination 62 and a cathode termination 72 in electrical connection with a capacitor element 33. The capacitor element 33 has an upper surface 37, lower surface 39, front surface 36, and rear surface 38. Although it may be in electrical contact with any of the surfaces of the capacitor element 33, the cathode termination 72 in the illustrated embodiment is in electrical contact with the lower surface 39 and rear surface 38. More specifically, the cathode termination 72 contains a first component 73 positioned substantially perpendicular to a second component 74. The first component 73 is in electrical contact and generally parallel with the lower surface 39 of the capacitor element 33. The second component 74 is in electrical contact and generally parallel to the rear surface 38 of the capacitor element 33. Although depicted as being integral, it should be understood that these portions may alternatively be separate pieces that are connected together, either directly or via an additional conductive element (e.g., metal).

The anode termination 62 likewise contains a first component 63 positioned substantially perpendicular to a second component 64. The first component 63 is in electrical contact and generally parallel with the lower surface 39 of the capacitor element 33. The second component 64 contains a region 51 that carries an anode lead 16. In the illustrated embodiment, the region 51 possesses a "U-shape" for further enhancing surface contact and mechanical stability of the lead 16.

The terminations may be connected to the capacitor element using any technique known in the art. In one embodiment, for example, a lead frame may be provided that defines the cathode termination 72 and anode termination 62. To attach the electrolytic capacitor element 33 to the lead frame, a conductive adhesive may initially be applied to a surface of the cathode termination 72. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives may be described in U.S. Patent Application Publication No. 2006/0038304 to Osako, et al., which is incorporated herein in its entirety by reference thereto for all purposes. Any of a variety of techniques may be used to apply the conductive adhesive to the cathode termination 72. Printing techniques, for instance, may be employed due to their practical and cost-saving benefits.

A variety of methods may generally be employed to attach the terminations to the capacitor. In one embodiment, for example, the second component 64 of the anode termination 62 and the second component 74 of the cathode termination 72 are initially bent upward to the position shown in FIG. 1. Thereafter, the capacitor element 33 is positioned on the cathode termination 72 so that its lower surface 39 contacts the adhesive and the anode lead 16 is received by the upper U-shaped region 51. If desired, an insulating material (not shown), such as a plastic pad or tape, may be positioned between the lower surface 39 of the capacitor element 33 and the first component 63 of the anode termination 62 to electrically isolate the anode and cathode terminations.

The anode lead 16 is then electrically connected to the region 51 using any technique known in the art, such as mechanical welding, laser welding, conductive adhesives, etc. For example, the anode lead 16 may be welded to the anode termination 62 using a laser. Lasers generally contain resonators that include a laser medium capable of releasing photons by stimulated emission and an energy source that excites the elements of the laser medium. One type of suitable laser is one in which the laser medium consist of an aluminum and yttrium garnet (YAG), doped with neodymium (Nd). The excited particles are neodymium ions $Nd^{3+}$. The energy source may provide continuous energy to the laser medium to emit a continuous laser beam or energy discharges to emit a pulsed laser beam. Upon electrically connecting the anode lead 16 to the anode termination 62, the conductive adhesive may then be cured. For example, a heat press may be used to apply heat and pressure to ensure that the electrolytic capacitor element 33 is adequately adhered to the cathode termination 72 by the adhesive.

Once the capacitor element is attached, the lead frame is enclosed within a resin casing, which may then be filled with silica or any other known encapsulating material. The width and length of the case may vary depending on the intended application. Suitable casings may include, for instance, "A", "B", "F", "G", "H", "J", "K", "L", "M", "N", "P", "R", "S", "T", "W", "Y", or "X" cases (AVX Corporation). Regardless of the case size employed, the capacitor element is encapsulated so that at least a portion of the anode and cathode terminations are exposed for mounting onto a circuit board.

Figure 5:
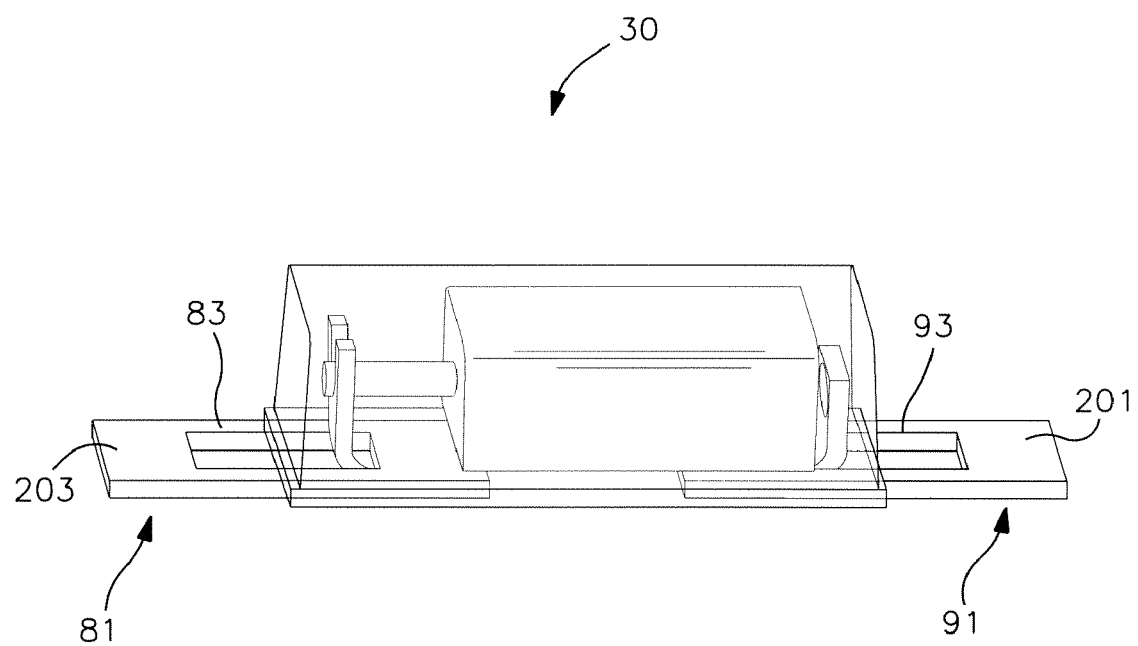
FIG. 5 is a perspective view of another embodiment of the electrolytic capacitor of the present invention.

As shown in FIG. 1, for instance, the capacitor element 33 is encapsulated in a case 78 so that a portion 81 of the first component 63 of the anode termination 62 and a portion 91 of the first component 73 of the cathode termination 72 extend outwardly through opposing ends of the casing 78. In FIG. 1, the exposed portions 81 and 93 are each in the form of spaced apart arm portions. However, the exposed portions need not possess this configuration. FIG. 5, for instance, shows an additional embodiment of the present invention in which the arm portions are connected by tie portions 201 and 203, respectively. Such tie portions 201 and 203 may improve the ability of the capacitor element 30 to be mounted onto a surface of a circuit board.

Regardless, the length of each of the portions 81 and 91 (e.g., in the −x direction of FIG. 1) relative to the length of the capacitor is generally selected so that a large enough area is provided for bonding to the circuit board without creating too large of a surface footprint. For example, although the actual lengths may vary depending on the case size of the capacitor, the ratio of the length of the portions 81 and/or 91 to the length of the case 78 is typically from 0.05 to about 1, in some embodiments from about 0.08 to about 0.5, and in some embodiments, from about 0.1 to about 0.3.

The anode termination portion 81 and the cathode termination portion 91 are desirably in a generally coplanar relationship with one another and optionally with a lower surface of the capacitor element 33 and/or casing 78. Although not required, other portions of the anode termination 62 and cathode termination 72 may also remain exposed after encapsulation. In FIG. 1, for instance, the terminations 62 and 72 are also exposed at a lower surface of the case. After encapsulation, exposed portions of the respective anode and cathode terminations 62 and 72 may be aged, screened, and trimmed to the desired size.

Once formed, the capacitor 30 may then be mounted onto a circuit board. More specifically, the generally coplanar portions 81 and 91 of the anode and cathode terminations define upper surfaces 83 and 93, respectively, that face the lower surface 39 of the capacitor element 33, as well as lower surfaces 85 and 95, respectively, that face away from the lower surface 39 of the capacitor element 33. The surfaces 83 and 93 are configured for mounting the anode termination 62 and cathode termination 72 within a recessed opening of a circuit board. In this manner, the capacitor 30 may be mounted "upside down" so that some or all of its thickness becomes embedded within the board itself, thereby minimizing the height profile of the capacitor 30 on the board.

Figure 2:
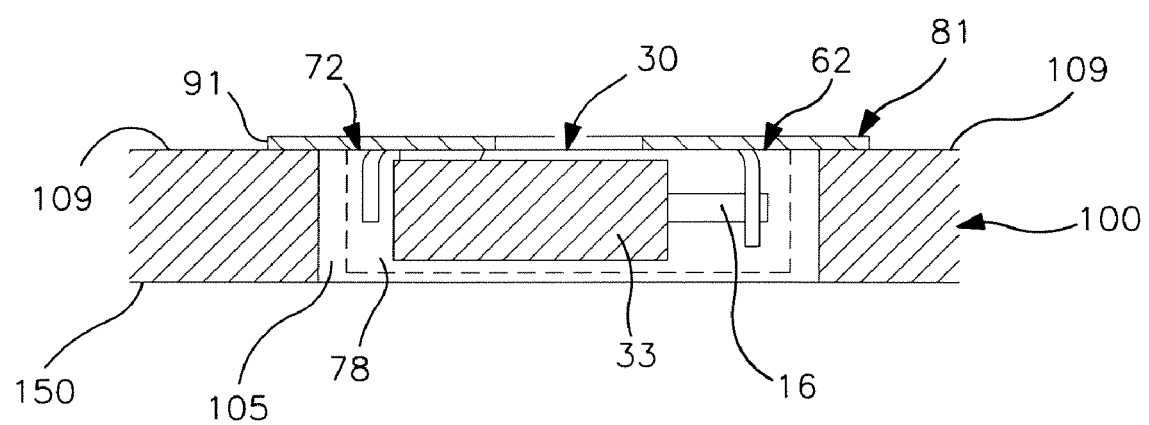
FIG. 2 is a cross-sectional view of one embodiment of the electrolytic capacitor of the present invention, show mounted onto a printed circuit board.
Figure 3:
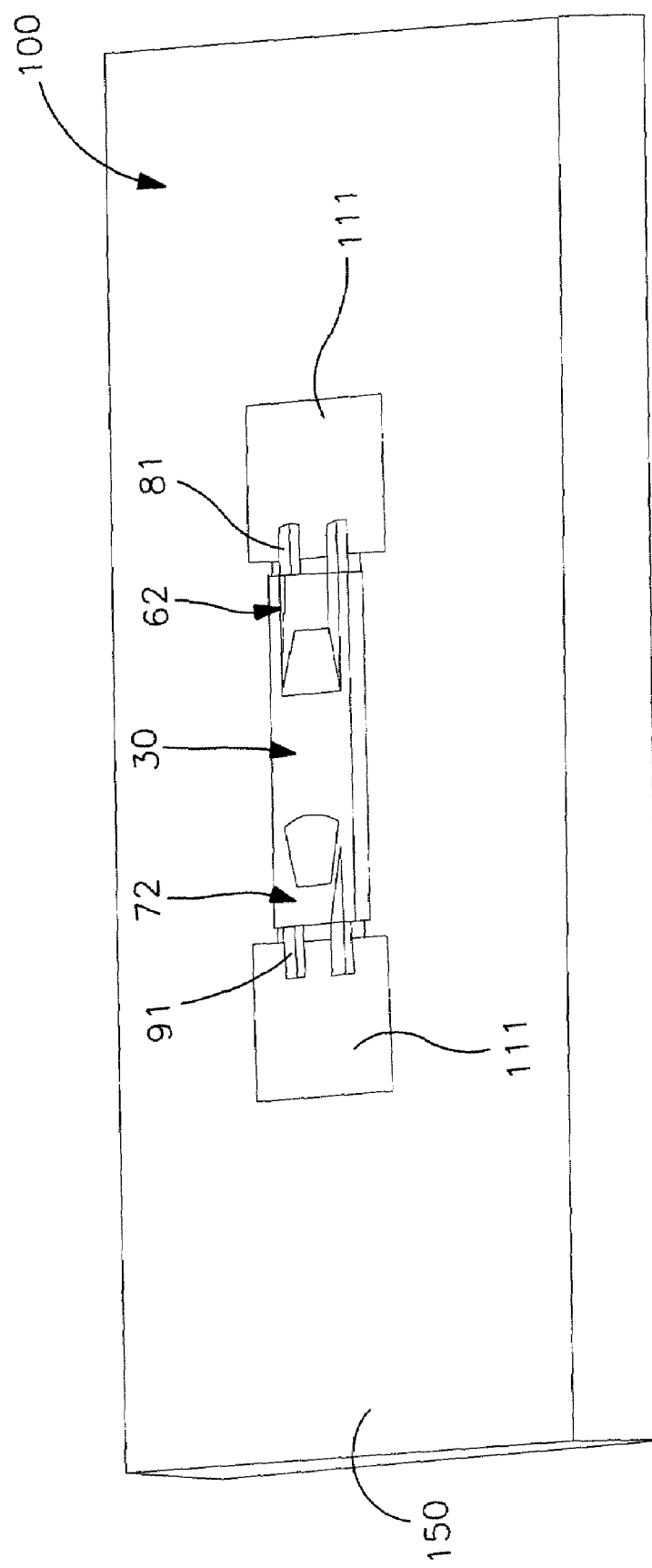
FIG. 3 is a top view of the capacitor shown in FIG. 2.
Figure 4:
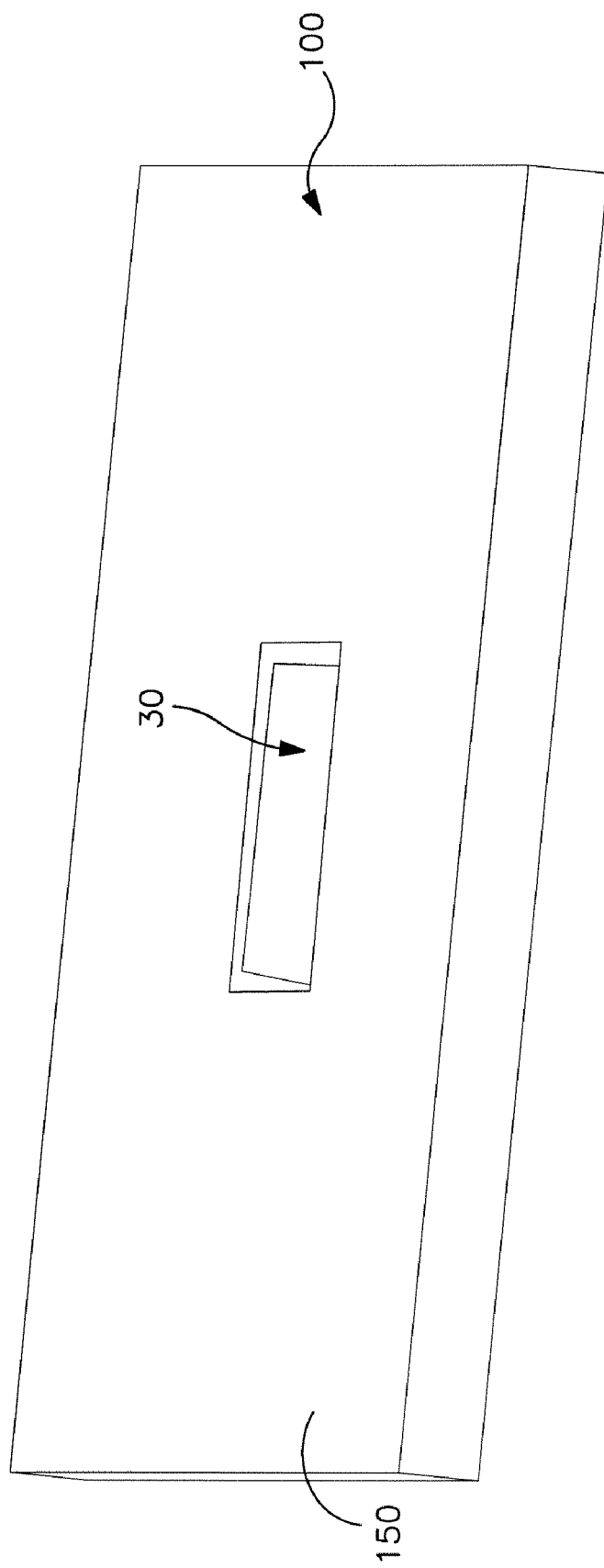
FIG. 4 is a bottom view of the capacitor shown in FIG. 2.

Referring to FIGS. 2-4, for example, one embodiment is shown in which the capacitor 30 of FIG. 1 is mounted in a printed circuit board 100 that contains a substrate 150 (e.g., insulating layer) and conductive members 111. It should be understood that various other electronic components may also be mounted onto the board 100 as is well known in the art and that a single capacitor is shown only for purposes of illustration. In any event, the board 100 has a mounting surface 109 through which an opening 105 is recessed between the conductive members 111. To minimize its height profile on the board, the capacitor 30 is embedded within the opening 105 and attached to the mounting surface 109 using known techniques, such as by soldering. Namely, the upper surface 83 of the exposed anode termination portion 81 and the upper surface 93 of the exposed cathode termination portion 91 are both attached to the conductive members 111 located on the mounting surface 109.

The degree of which the capacitor 30 is embedded depends on a variety of factors, such as the thickness of the board 100, the case size, etc. The thickness of the casing may be, for instance, from about 0.05 to about 4.0 millimeters, in some embodiments, from about 0.1 to about 2 millimeters, and in some embodiments, from about 0.2 to about 1.0 millimeter. Likewise, the thickness of the circuit board (not including the attached electrical components) may be from about 0.1 to about 5 millimeters, in some embodiments, from about 0.2 to about 3 millimeters, and in some embodiments, from about 0.4 to about 1.5 millimeters. Thus, depending on the particular thicknesses employed, the capacitor 30 may be embedded so that the lower surface of the case 78 is substantially coplanar with the upper surface of the board 100. Alternatively, the capacitor 30 may be embedded so that its lower surface extends slightly above the upper surface of the board 100. Regardless, the height profile occupied by the capacitor is decreased and may be controlled depending on the desired use.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A circuit board comprising:
  a substrate that defines a mounting surface on which is located opposing conductive members, wherein a recessed opening is provided in the mounting surface between the conductive members; and
  a capacitor that comprises:
    a solid electrolytic capacitor element containing an anode and cathode;
    an anode termination that is electrically connected to the anode and contains a first component that is generally parallel to a lower surface of the capacitor element;
    a cathode termination that is electrically connected to the cathode and contains a second component that is generally parallel and physically connected to a lower surface of the capacitor element, wherein the second component exists in a single plane; and
    a case that encapsulates the solid electrolytic capacitor element yet leaves exposed at least a portion of the first component and the second component,
    wherein a lower surface of the case is generally coplanar with a lower surface of the first component and a lower surface of the second component,
    wherein the exposed portions of the first component and the second component extend outwardly from the case in a direction parallel to a lower surface of the capacitor element and in a generally coplanar relationship, the exposed portions each defining an upper surface facing the capacitor element and an opposing lower surface facing away from the capacitor element, wherein the upper surfaces of the first component and the second component are electrically connected to respective conductive members so that the capacitor element is substantially embedded within the recessed opening and so that a surface of the case is substantially coplanar with the mounting surface of the substrate.

2. The circuit board of claim 1, wherein the second component of the cathode termination is connected to the capacitor element by a conductive adhesive.

3. The circuit board of claim 1, wherein the capacitor element includes a dielectric layer overlying the anode, and a cathode overlying the dielectric layer that includes a solid electrolyte, and wherein an anode lead is electrically connected to the anode.

4. The circuit board of claim 3, wherein the anode includes tantalum, niobium, or an electrically conductive oxide thereof.

5. The circuit board of claim 3, wherein the solid electrolyte includes manganese dioxide, a conductive polymer, or a combination thereof.

6. The circuit board of claim 3, wherein the anode lead is positioned within the recessed opening.

7. The circuit board of claim 1, wherein the first component of the anode termination is physically connected to the lower surface of the capacitor element.

8. The circuit board of claim 1, wherein the anode termination further comprises a third component that is generally perpendicular to the first component.

9. The circuit board of claim 8, wherein the third component contains a U-shaped region to which an anode lead is electrically connected.

10. The circuit board of claim 8, wherein the third component is encapsulated within the case.

11. The circuit board of claim 1, wherein the cathode termination further comprises a fourth component that is generally perpendicular to the second component and is electrically connected to a rear surface of the capacitor element.

12. The circuit board of claim 11, wherein the fourth component is encapsulated within the case.

13. The circuit board of claim 1, wherein the ratio of the length of the exposed portion of the first component or the length of the exposed portion of the second component to the length of the case is from about 0.05 to about 1.

14. The circuit board of claim 1, wherein the ratio of the length of the exposed portion of the first component or the length of the exposed portion of the second component to the length of the case is from about 0.08 to about 0.5.

15. The circuit board of claim 1, wherein the case has a thickness of from about from about 0.1 to about 2.0 millimeters and the substrate has a thickness of from about 0.2 to about 3 millimeters.

16. The circuit board of claim 1, wherein the lower surface of the case extends slightly above the mounting surface of the substrate.

* * * * *